United States Patent [19]

Gruber

[11] 4,024,296
[45] May 17, 1977

[54] PHOTOCATALYST SYSTEM AND PIGMENTED ACTINIC LIGHT POLYMERIZABLE COATING COMPOSITIONS CONTAINING THE SAME

[75] Inventor: Gerald W. Gruber, Sewickley, Pa.

[73] Assignee: PPG Industries, Inc., Pittsburgh, Pa.

[22] Filed: Feb. 2, 1976

[21] Appl. No.: 654,499

[52] U.S. Cl. .................................. 427/53; 427/54; 204/159.23; 252/426; 96/115 P
[51] Int. Cl.² .......................................... B05D 3/06
[58] Field of Search .......... 427/54, 53; 204/159.23; 252/426; 96/115 P

[56] References Cited
UNITED STATES PATENTS 3,368,900  2/1968  Burg ..................................... 427/54

OTHER PUBLICATIONS

Herkstroeter et al. J. Am. Chem. Soc. V86 pp. 4537–4540.

Primary Examiner—John H. Newsome
Attorney, Agent, or Firm—George D. Morris; J. Timothy Keane

[57] ABSTRACT

A photocatalyst system comprising an aromatic ketone photopolymerization activator having a triplet energy in the range of from about 54 kilocalories per mole to about 72 kilocalories per mole and phenanthrenequinone is present in an actinic light polymerizable coating composition containing organic polymerizable material containing a plurality of sites of ethylenic unsaturation and ultraviolet light absorbing hiding pigment. Coatings of the coating composition are polymerized by exposing them to actinic light of a wavelength where absorption by the pigment is substantial and to actinic light of a wavelength where absorption by the pigment is insubstantial.

27 Claims, No Drawings

PHOTOCATALYST SYSTEM AND PIGMENTED ACTINIC LIGHT POLYMERIZABLE COATING COMPOSITIONS CONTAINING THE SAME

The use of actinic light polymerizable coating compositions is becoming more widespread. This growing interest is primarily occasioned by the low power requirements of actinic light sources as compared to thermal ovens, by the low levels of environmental pollution which can be obtained, and by the minimal space required for actinic light curing equipment. Nonetheless, several problems have arisen which have retarded the use of actinic light polymerizable coating compositions in certain areas.

One problem is that of achieving adequate hiding in coating systems where hiding of the substrate is desired. In theory, one method of obtaining hiding is to incorporate pigments into the coating composition. Unfortunately, many of the pigments known to provide opacity to non-radiation curable coatings absorb strongly in most areas of the ultraviolet light region, viz., electromagnetic radiation having wavelengths in the range of from about 180 nanometers to about 400 nanometers. This absorption prevents adequate quantities of ultraviolet light from penetrating very far into the interior of the film. The result is inadequate polymerization of the interior region of the coating, or, using the terminology of the art, inadequate "through cure". Ultraviolet light absorbing hiding pigments which are desirably used in coating compositions due to their excellent hiding characteristics include, but are not limited to, titanium dioxide (including rutile and anatase), zinc sulfide, zinc oxide, antimony trioxide and lithopone. The preferred pigment is titanium dioxide. Rutile is especially preferred.

It has now been found that the use of 9,10-phenanthrenequinone in actinic light polymerizable coating compositions containing ultraviolet light absorbing hiding pigments allows the interior of coating of the composition to be adequately polymerized. Although it is not desired to be bound by any theory, it is believed that the reason phenanthrenequinone performs satisfactorily is as follows: Although the pigments absorb light strongly in the ultraviolet region at a wavelength of about 200 nanometers, the absorption diminishes as the wavelength of light is increased. At about 400 nanometers, the absorption has diminished to a small value so that a significant portion of such light is able to reach the interior of the coatings. The absorption of phenanthrenequinone, however, remains at a high value well into the visible spectrum before it too diminishes to a small value. Phenanthrenequinone is, therefore, suitable for pigmented systems because it absorbs actinic light having a wavelength in a region of substantial pigment transparency and uses the energy of the absorbed photons to produce free radicals capable of causing polymerization of organic polymerizable material containing a plurality of sites of ethylenic unsaturation.

The use of phenanthrenequinone alone is not without disadvantage, however. Since phenanthrenequinone absorbs photons, as indeed it must in order to produce free radicals, and since much of the adsorption is in the violet and blue regions of the visible spectrum, phenanthrenequinone is a highly colored compound having a yellow to orange hue. Although the photoreaction of phenanthrenequinone produces compounds which do not significantly absorb in the visible region and hence are not colored, some of the phenanthrenequinone remains at the end of the polymerization process and imparts a yellow or orange color to the polymerized coating. Yellow and orange coatings are not desirable where opaque white coatings or opaque coatings of colors other than yellow or orange are desired. A further disadvantage is that phenanthrenequinone does not materially reduce the oxygen inhibition of the polymerization process.

It has now been found that the presence of at least one aromatic ketone photopolymerization activator which has a triplet energy in the range of from about 54 kilocalories per mole to about 72 kilocalories per mole causes more complete reaction of the phenanthrenequinone in the thin surface layer resulting in a much whiter appearance of the coating.

According to the present invention, a substrate is coated with a coating composition containing (1) at least one aromatic ketone photopolymerization activator having a triplet energy in the range of from about 54 kilocalories per mole to about 72 kilocalories per mole, (2) phenanthrenequinone, (3) organic polymerizable material containing a plurality of sites of ethylenic unsaturation and capable of being free radically addition polymerized by interaction with said photopolymerization activator and said phenanthrenequinone upon exposure to actinic light, and (4) ultraviolet light absorbing hiding pigment. The coated substrate is then exposed to actinic light of two kinds to thereby polymerize the coating into a hard, infusible film throughout its thickness. Actinic light of the first kind has a wavelength in the ultraviolet region of the spectrum such that the ultraviolet light absorbing hiding pigment is substantially opaque thereto, and is absorbable by the photopolymerization activator to produce free radicals capable of causing the polymerization of organic polymerizable material. Actinic light of the second kind has a wavelength longer than that of actinic light of the first kind and such that the ultraviolet light absorbing pigment is substantially transparent thereto. Actinic light of the second kind is also absorbable by phenanthrenequinone to produce free radicals capable of causing polymerization of organic polymerizable material.

The photopolymerization activator and the phenanthrenequinone constitute the photocatalyst system of the invention. Actinic light polymerizable coating compositions of the invention contain the photocatalyst system of the invention, organic polymerizable material containing a plurality of sites of ethylenic unsaturation and capable of being free radically addition polymerized by interaction with the photopolymerization activator and the phenanthrenequinone upon exposure to actinic light and ultraviolet light absorbing hiding pigment. It is preferred that the sites of ethylenic unsaturation of the organic polymerizable material be sites of acrylic unsaturation.

As used throughout the instant specification and claims, unless otherwise indicated, the term "acrylic unsaturation" is used in its broad sense to mean the unsaturation provided by unsubstituted acrylyl groups or α-substituted acrylyl groups such as methacrylyl, ethacrylyl and α-chloroacrylyl groups.

Examples of photopolymerization activators which may be used in the present invention are:
 benzil
 3,4-benzofluorene
 1-acetylnaphthalene 1-benzoylnaphthalene
9-acetylphenanthrene
3-acetylphenanthrene
2-acetylnaphthalene
2-benzoylnaphthalene
4-phenylbenzophenone
4-phenylacetophenone
anthraquinone
2-methylanthraquinone
thioxanthone
2-chlorothioxanthone
3,4-methylenedioxyacetophenone
4-cyanobenzophenone
4-benzoylpyridine
2-benzoylpyridine
4,4'-dichlorobenzophenone
4-trifluoromethylbenzophenone
3-methoxybenzophenone
4-chlorobenzophenone
3-chlorobenzophenone
3-benzoylpyridine
4-methoxybenzophenone
3,4-dimethylbenzophenone
4-methylbenzophenone
benzophenone
2-methylbenzophenone
4,4'-dimethylbenzophenone
2,5-dimethlbenzophenone
2,4-dimethylbenzophenone
4-cyanoacetophenone
4-fluorobenzophenone
o-benzoylbenzophenone
4,4'-dimethoxybenzophenone
4-acetylpyridine
3,4,5-trimethylacetophenone
3,5-dimethylacetophenone
4-bromoacetophenone
4-methoxyacetophenone
3,4-dimethylacetophenone
triphenylmethylacetophenone
anthrone
4-chloracetophenone
4-trifluoromethylacetophenone
2-chloroanthraquinone
o-benzoylbenzoic acid
ethyl benzoylbenzoate
dibenzosuberone
o-benzoylbenzophenone
acrylyloxyethyl benzoylbenzoate
4-acrylyloxybenzophenone
2-acrylyloxyethoxybenzophenone A preferred class of photopolymerization activator comprises aromatic ketones which may be represented by the formula:

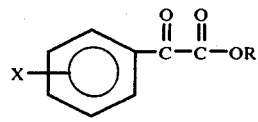

wherein
R is hydrogen, alkyl containing from 1 to about 22 carbon atoms, benzyl, phenyl, hydroxylakyl containing from 1 to about 10 carbon atoms, chloroalkyl containing from 1 to about 10 carbon atoms, bromoalkyl containing from 1 to about 10 carbon atoms, alkoxyalkyl where the alkoxy portion contains from 1 to about 4 carbon atoms and where the alkyl portion contains from 1 to about 10 carbon atoms, or phenoxyalkyl where the alkyl portion contains from 1 to about 10 carbon atoms;

X is hydrogen, halo, alkoxy containing from 1 to about 4 carbon atoms or alkyl containing from 1 to about 4 carbon atoms;

R is preferably hydrogen, alkyl containing from 1 to about 12 carbon atoms, benzyl or phenyl. Most preferably, R is hydrogen, alkyl containing from 1 to about 4 carbon atoms, benzyl or phenyl. X is preferably hydrogen, chloro, methoxy, methyl or ethyl. X is preferably located in the ortho position although the meta and para positions are satisfactory.

Additional minor substituents which do not render the compound unsuitable for its intended purpose may be placed on the phenyl ring.

Examples of the preferred class of photopolymerization activators are:
methyl phenylglyoxylate
butyl phenylglyoxylate
benzyl phenylglyoxylate
butoxyethyoxy phenylglyoxylate
phenoxyethoxy phenylglyoxylate
dodecyl phenylglyoxylate
phenyl phenylglyoxylate
ethyl o-chlorophenylglyoxylate
phenylglyoxylic acid The preferred photopolymerization activators are methyl phenylglyoxylate, ethyl phenylglyxoylate, butyl phenylglyoxylate and butyoxyethyl phenylglyoxylate. The esters of phenylglyoxylic acid may be prepared by reacting phenylglyoxyloyl chloride (Kharasch and Brown, *Journal of the American Chemical Society*, vol. 64, page 329 et seq. [1942]) with the appropriate alcohol.

There are many types of organic polymerizable materials which may be used in the practice of the invention. In general, these molecules contain a plurality of sites of ethylenic unsaturation and are capable of being free radically addition polymerized by interaction with the aromatic ketone photopolymerization activator and phenanthrenequinone upon exposure to actinic light. The sites of ethylenic unsaturation may lie along the backbone of the molecule or they may be present in side chains attached to the molecular backbone. As a further alternative, both of these arrangements may be present concurrently. Most often, the organic polymerizable material comprises ethylenically unsaturated polyester containing a plurality of sites of ethylenic unsaturation, polymer having a plurality of sites of acrylic unsaturation, monomer having a plurality of sites of acrylic unsaturation or mixture thereof.

The ethylenically unsaturated polyesters constitute a useful class of organic polymerizable material. These polyesters are ordinarily esterification products of ethylenically unsaturated polycarboxylic acids and polyhydric alcohols. Usually, the ethylenic unsaturation is in the alpha, beta position.

The ethylenically unsaturated polycarboxylic acids include maleic acid, fumaric acid, aconitric acid, itaconic acid, citraconic acid, mesaconic acid, muconic acid and dihydromuconic acid and halo and alkyl derivatives of such acids. The preferred acids are maleic acid and fumaric acid. Especially preferred is maleic acid. Mixtures of ethylenically unsaturated polycarboxylic acids may be used or only a single such acid may be employed. The anhydrides of these acids, where the anhydrides exist, are, of course, embraced by the term "acid", since the polyesters obtained therefrom are essentially the same whether the acid or anhydride is used in the reaction.

One or more saturated polycarboxylic acids may optionally be utilized in combination with the ethylenically unsaturated acid or anhydride in the preparation of unsaturated polyesters. Such acids, especially the saturated dicarboxylic acids, increase the length of the polyester without adding additional crosslinking sites, which is a desired feature in some polyesters. Saturated tricarboxylic acids and saturated acids of higher carboxylic functionality may be used to provide branching where this is desirable.

For purposes of the present invention, the aromatic nuclei of aromatic acids such as phthalic acid are generally regarded as saturated since the double bonds do not ordinarily react by addition as do ethylenic groups. Therefore, wherever the term "unsaturated" is utilized, it is to be understood that such terms includes aromatic unsaturation or other form of unsaturation which does not react by addition, unless otherwise qualified.

Examples of useful saturated polycarboxylic acids include oxalic acid, malonic acid, succinic acid, methylsuccinic acid, 2,2-dimethylsuccinic acid, 2,3-dimethylsuccinic acid, hexylsuccinic acid, glutaric acid, 2-methylglutaric acid, 3-methylglutaric acid, 2,2-dimethylglutaric acid, 3,3-dimethylglutaric acid, 3,3-diethylglutaric acid, adipic acid, pimelic acid, suberic acid, azelaic acid, sebaccic acid, phthalic acid, isophthalic acid, terephthalic acid, tetrachlorophthalic acid, 1,2-hexahydrophthalic acid, 1,3-hexahydrophthalic acid, 1,4-hexahydrophthalic acid, 1,1-cyclobutanedicarboxylic acid and trans-1,4-cyclohexanedicarboxylic acid. As in the case of the ethylenically unsaturated polycarboxylic acids, the anhydrides of the saturated acids, where the anhydrides exist, are embraced by the term "acid" since the polyesters obtained therefrom are essentially the same.

The ethylenically unsaturated polycarboxylic acids are usually present in an amount in the range of from about 10 mole percent to about 100 mole percent of the polycarboxylic acids employed. Preferably, they are present in the range of from about 50 mole percent to about 100 mole percent.

The polyhydric alcohols useful in preparing ethylenically unsaturated polyesters include saturated polyhydric alcohols such as ethylene glycol, 1,3-propanediol, propylene glycol, 2,3-butanediol 1,4-butanediol, 2-ethylbutane-1,4-diol, 1,5-pentanediol, 1,6-hexanediol, 1,7-heptanediol, 1,8-octanediol, 1,9-nonanediol, 1,10-decanediol, 2,10-decanediol, 1,4-cyclohexanediol, 1,4-dimethylolcyclohexane, 2,2-diethylpropane-1,3-diol, 3-methylpentane-1,4-diol, 2,2-diethylbutane-1,3-diol, 2,2-dimethylpropane-1,3-diol, 4,5-nonanediol, diethylene glycol, triethylene glycol, dipropylene glycol, glycerol, pentaerythritol, erythritol, sorbitol, mannitol, 1,1,1-trimethylolpropane, trimethylolethane, and 2,2-dimethyl-3-hydroxypropyl 2,2-dimethyl-3-hydroxypropionate. Ethylenically unsaturated polyhydric alcohols such as 2-butene-1, 4-diol may be used alone or in admixture with the saturated polyhydric alcohols. Of course, mixtures of saturated polyhydric alcohols or mixtures of unsaturated polyhydric alcohols may be employed. If unsaturated polyhydric alcohols are used to introduce ethylenic unsaturation into the polyester, the preparation of ethylenically unsaturated polycarboxylic acid may be reduced correspondingly, if desired.

A mixture of ethylenically unsaturated polyesters containing a plurality of sites of ethylenic unsaturation may be used, if desired.

Another useful class of organic polymerizable material is polymer having a plurality of sites of acrylic unsaturation. The sites of acrylic unsaturation may be provided by acrylyl groups or α-substituted acrylyl groups such as methacrylyl, ethacrylyl and α-chloroacrylyl. The sites of acrylic unsaturation may be terminal groups of the polymer, they may be in sidechains attached to the molecular backbone of the polymer or both.

Polymers having acrylic unsaturation in sidechains attached to the molecular backbone are usually prepared by including one or more monomers which, when interpolymerized with other monomers, to form the polymer, provides reactive sites attached to the polymer along the backbone. Acrylically unsaturated compounds having at least one functional group which will react with the reactive sites on the polymeric backbone are then used to introduce the acrylic unsaturation into the molecule. The usual reactive sites attached directly or indirectly to the polymer are hydroxy, amino, carboxy, carbamyl, isocyanato or epoxy. Hydroxy or carboxy are most often used. When the reactive sites are hydroxy, the acrylically unsaturated compound usually has carboxy, haloformyl (most often chloroformyl) or isocyanato functionality. When the reactive sites on the polymer are amino, the acrylically unsaturated compound usually has isocyanato, haloformyl (again, most often chloroformyl) or epoxy functionality. When the reactive sites on the polymer are carboxy, the acrylically unsaturated compound generally has hydroxy, epoxy or isocyanato functionality. When the reactive sites are carbamyl, they are usually reacted with formaldehyde to produce N-methylol carbamyl groups. When the reactive sites are isocyanato, the acrylically unsaturated compound ordinarily contains hydroxy or carboxy functionality. When the reactive sites are epoxy (usually glycidyl), the acrylically unsaturated compound generally has carboxy functionality. The acrylically unsaturated compound ordinarily contains carboxy, haloformyl or isocyanato functionality.

The polymer having reactive sites attached thereto can itself be any of many types, as for example, polyacrylates, polyamides, polyesters, polyethers or polyurethanes.

The term polyacrylate is used in its broadest sense to include not only polymerized unsubstituted acrylates, but also polymerized α-substituted acrylates, such as methacrylates, ethacrylates and α-chloroacrylates. Compounds from any of these subclasses may be used alone, but most often, compounds from two or more subclasses are interpolymerized.

Examples of suitable monomers which may be used in the preparation of the polyacrylate polymer include methyl acrylate, ethyl acrylate, propyl acrylate, isopropyl acrylate, butyl acrylate, isobutyl acrylate, sec-butyl acrylate, tert-butyl acrylate, amyl acrylate, hexyl acrylate, heptyl acrylate, octyl acrylate, 2-ethylhexyl acrylate, decyl acrylate, dodecyl acrylate, methyl methacrylate, ethyl methacrylate, propyl methacrylate, isopropyl methacrylate, butyl methacrylate, isobutyl methacrylate, sec-butyl methacrylate, tert-butyl methacrylate, amyl methacrylate, hexyl methacrylate, heptyl methacrylate, octyl methacrylate, 2-ethylhexyl methacrylate, decyl methacrylate, dodecyl methacrylate methyl α-chloroacrylate, ethyl α-chloroacrylate, propyl α-chloroacrylate, hexyl α-chloroacrylate, octyl α-chloroacrylate, decyl α-chloroacrylate and dodecyl α-chloroacrylate. Esters of unsubstituted acrylic acid and methylacrylic acid are most often used.

Acrylic monomers which introduce reactive sites to the polymer molecule include acrylic acid, 2-hydroxyethyl acrylate, 2-hydroxypropyl acrylate, 3-hydroxypropyl acrylate, glycidyl acrylate, acrylamide, 2-aminoethyl acrylate, methacrylic acid, 2-hydroxyethyl methacrylate, 2-hydroxypropyl methacrylate, 3-hydroxypropyl methacrylate, glycidyl methacrylate, methacrylamide, 2-aminoethyl methacrylate, 3-aminopropyl methacrylate and α-chloroacrylic acid.

Other ethylenically unsaturated monomers are often included. Examples of these compounds are styrene and α-methylstyrene.

The amount of acrylic monomers which are used to introduce reactive sites to the polymer molecule may vary widely, but they are ordinarily present in the range of from about 3 percent to about 50 percent by weight of the ethylenically unsaturated monomers interpolymerized. An amount in the range of from about 4 percent to about 25 percent is most often the case.

Addition polymerization may be effectuated by combining the ethylenically unsaturated monomers with a free radical initiator and heating the mixture. Exemplary free radical initiators are organic peroxides such as ethyl peroxide and benzoyl peroxide; hydroperoxides such as methyl hydroperoxide, certain azo compounds such as α,α'-azobisisobutyronitrile and γ,γ'-azobis(γ-cyanovaleric acid); persulfates; peracetates such as methyl peracetate and tert-butyl peracetate; peroxalates such as dimethyl peroxalate and di(tert-butyl) peroxalate; disulfides such as dimethyl thiuram disulfide and ketone peroxides such as methyl ethyl ketone peroxide. The polymerization may be accomplished in the presence or absence of an inert solvent. Temperatures in the range of from about 75° F. to about 400° F. are generally employed. More often, temperatures in the range of from about 100° F. to about 300° F. are used.

When the polymer is a polyamide, polyester, polyether or polyurethane, the principles are analogous to those given for the polyacrylates. The known reactions for forming such polymers will, of course, be used instead of the addition polymerization reaction illustrated above for the polyacrylates.

Other examples of satisfactory polymers having a plurality of sites of acrylic unsaturation are acrylic polyester and acrylic polyamide molecules represented by the formulae:

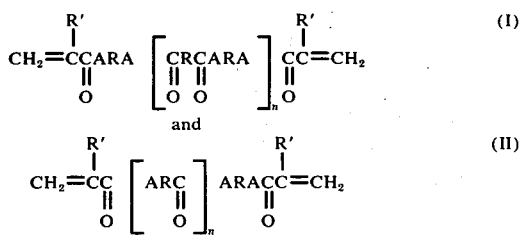

wherein
$n$ is an integer in the range of from 1 to 4;

each R independently represents a divalent aliphatic, cycloaliphatic or aromatic hydrocarbon radical having from 1 to 10 carbon atoms;
each R' independently represents hydro, methyl or ethyl;
and each A independently represents O or NH.

It is preferred that every A represent O. The polyester and polyamide oligomers represented by formula (I) may be prepared by reacting dicarboxylic acids or acid amides and dihydric alcohols or diamines and then reacting the product with an unsubstituted acrylic acid or an α-substituted acrylic acid. The acrylic polyester and polyamide oligomers represented by formula (II) may be prepared by reacting a hydroxy functional monocarboxylic acid, a dimer, trimer or a tetramer of such acid, an amino functional monocarboxylic acid or a dimer, trimer or tetramer of such acid with an unsubstituted or α-substituted acrylic acid. Where desired, the lactone may be used in lieu of the hydroxy functional monocarboxylic acid and the lactam may be used in place of the amino functional monocarboxylic acid.

A mixture of polymers having a plurality of sites of acrylic unsaturation may be used, if desired.

Another useful class of organic polymerizable material is monomer having a plurality of sites of acrylic unsaturation. Such monomers generally comprise divalent, trivalent or tetravalent organic radicals whose bonds are satisfied with unsubstituted acrylyloxy or α-substituted acrylyloxy groups. The polyvalent radical may be aliphatic, cycloaliphatic or aromatic. Usually, the molecular weight of the monomer is in the range of from about 170 to about 1000. Examples of such monomers are the diacrylates and dimethacrylates of ethylene glycol, 1,3-propanediol, propylene glycol, 2,3-butanediol, 1,4-butanediol, 2-ethylbutane-1,4-diol, 1,5-pentanediol, 1,6-hexanediol, 1,7-heptanediol, 1,8-octanediol, 1,9-nonanediol, 1,10-decanediol, 2,10-decanediol, 1,4-cyclohexanediol, 1,4-dimethylolcyclohexane, 2,2-dimethylpropane-1,3-diol, 3-methylpentane-1,4-diol, 4,5-nonanediol, diethylene glycol, triethylene glycol, propylene glycol, 5,5-dimethyl-3,7-dioxanonane-1,9-diol, 2,2-dimethyl-3-hydroxypropyl 2,2-dimethyl-3-hydroxypropionate, Bisphenol A diglycidyl ether, 1,4-butanediol diglycidyl ether and neopentyl glycol diglycidyl ether; the triacrylates, trimethacrylates, diacrylates and dimethacrylates of glycerol, 1,1,1-trimethylolpropane and trimethylolethane; and the tetracrylates, tetramethacrylates, triacrylates, trimethacrylates, diacrylates and dimethacrylates of pentaerythritol and erythritol. The acrylic groups on the monomer molecules are usually the same, but they may be different as exemplified by the compound 2,2-dimethyl-1-acrylyloxy-3-methacrylyloxypropane.

A mixture of monomers having a plurality of sites of acrylic unsaturation may be used, if desired.

Additional monomers having one or more vinyl groups which crosslink with the organic polymerizable material containing a plurality of sites of ethylenic unsaturation heretofore described may optionally be present in the coating composition. Examples are N-vinyl-2-pyrrolidone, styrene, α-methylstyrene, divinyl benzene, vinyl toluene, vinyl benzoate, vinyl acetate, vinyl propionate and diallyl phthalate. Particularly preferred are monomers having monoacrylic functionality which crosslink with the resin having acrylic unsaturation which may optionally be present in the coating composition. Examples of monoacrylic functional monomers which may be used are methyl acrylate, methyl methacrylate, ethyl acrylate, ethyl methacrylate, propyl acrylate, propyl methacrylate, butyl acrylate, butyl methacrylate, hexyl acrylate, hexyl methacrylate, octyl acrylate and octyl methacrylate. The preferred vinyl functional monomers are liquid compounds miscible with the resin. The use of one or more vinyl functional monomers is desirable. A benefit is that the vinyl functional monomer usually acts as a reactive solvent for the resin thereby providing coating compositions having a satisfactorily low viscosity without using an inordinate amount, if any at all, of volatile, nonreactive solvent.

The vinyl functional monomer, or mixtures of vinyl functional monomers, may be employed over a broad range. At the lower end of the range, no vinyl functional monomer need be used. At the upper end of the range, about 80 percent by weight of the binder can be vinyl functional monomer. Often, the vinyl functional monomer will be present in the coating composition in the range of from about 1 to about 80 percent by weight of the binder of the coating composition. Ordinarily, when used, the vinyl functional monomer will be in the range of from about 15 to about 30 percent by weight of the binder. Extender pigments which are generally transparent to ultraviolet light are optional ingredients which are often included in the coating composition. Examples of suitable extender pigments are finely divided particles of silica, barytes, calcium carbonate, talc, magnesium silicate, aluminum silicate, etc. When used, extender pigment is generally present in an amount of the range of from about 1 to about 70 percent by weight of the coating composition. An amount in the range of from about 1 to about 50 percent is more often employed. Most often, it is present in the range of from about 1 to about 35 percent by weight of the coating composition. Although a single extender pigment is ordinarily used, mixtures of several extender pigments are satisfactory.

Another optional ingredient which is often included in the coating composition is an inert volatile organic solvent. Mixtures of several inert volatile organic solvents may be used when desired. Examples of suitable inert volatile organic solvents are acetone, methyl ethyl ketone, methyl isobutyl ketone, methyl alcohol, ethyl alcohol, propyl alcohol, isopropyl alcohol, butyl alcohol, sec-butyl alcohol, isobutyl alcohol, tert-butyl alcohol, amyl alcohol, hexyl alcohol, 2-ethylhexyl alcohol, cellosolve, ethyl cellosolve, cellosolve acetate, 2-ethylhexyl acetate, tetrahydrofuran, and aliphatic naphtha. When inert volatile organic solvent is used, it is usually present in the range of from about 1 to about 15 percent by weight of the vehicle.

Another optional ingredient is resinous pigment dispersant or grinding vehicle. There may be resinous dispersants which are commercially available for that purpose. These resins are often low molecular weight resins which have a high carboxyl content. Illustrative of such pigment dispersants are the so-called Acrysol dispersants such as Acrysol I-94, a copolymer of butyl acrylate, methyl methacrylate, styrene and acrylic acid, available commercially from the Rohm and Haas Company. These dispersants are used in the manner and in amounts known to the art.

Conventional plasticizers such as dibutyl phthalate, butyl benzyl phthalate, diisooctyl phthalate, decyl butyl phthalate, diisooctyl adipate, dibutyl sebacate, butyl benzoate triisooctyl trimellitate, n-octyl n-decyl trimellitate, and tricresyl phosphates and flow promoters such as phenyl benzoate, dibenzyl ketone, benzyl methyl ketone and the like may also be optionally included in amounts customary in the art.

Various conventional chain modifying agents or chain-transfer agents may be included in the mixture. The preferred chain-transfer agents are the mercaptan compounds such as dodecyl mercaptan, tertiary-dodecyl mercaptan, octyl mercaptan, hexyl mercaptan and the like. The quantity and manner of use are also known in the art.

Any of the conventional viscosity control agents may be optionally employed in the composition. The preferred materials are resinous or polymeric viscosity control agents. Many of these resinous materials are available. Illustrative of such materials are cellulose acetate butyrate, sodium carboxylmethyl cellulose and the like. The use of such resinous or polymeric viscosity control agents is advantageous in that it permits the mixture to be prepared in the form of a viscous mass or syrup having sufficient viscosity to remain in place on the substrate until polymerization is effected. These viscosity control agents are used in the manner and in amounts known to the art.

The amount of aromatic ketone photopolymerization activator present in the photocatalyst system of the invention may vary widely. Often it is present in the range of from about 25 percent to about 98 percent by weight of the photocatalyst system. An amount in the range of from about 35 percent to about 97 percent is typical. From about 45 percent to about 95 percent is preferred.

The amount of phenanthrenequinone present in the photocatalyst system of the invention may likewise vary widely. Often it is present in the range of from about 2 percent to about 75 percent by weight of the photocatalyst sytem. An amount in the range of from about 3 percent to about 65 percent is more often used. From about 5 percent to about 55 percent is preferred.

The amount of aromatic ketone photopolymerization activator present in the actinic light polymerizable coating compositions of the invention may be widely varied. Usually, the photopolymerization activator is present in an amount in the range of from about 0.01 percent to about 50 percent based on the weight of the binder of the coating composition. More often, an amount in the range of from about 0.1 percent to about 20 percent is employed. From about 0.5 to about 10 percent by weight based on the weight of the binder is preferred.

The amount of phenanthrenequinone present in the coating composition may also be widely varied. Ordinarily, the phenanthrenequinone is present in the amount in the range of from about 0.005 percent to about 5 percent by weight based on the wieght of the binder of the coating composition. Most often, an amount in the range of from about 0.01 percent to about 3 percent is used. From about 0.1 percent to about 1 percent by weight based on the weight of the binder is preferred.

The amount of organic polymerizable material having a plurality of sites of ethylenic unsaturation present in the polymerizable coating composition is subject to wide variation. The material is ordinarily present in an amount in the range of from about 20 to 100 percent by weight of the binder of the coating composition. An amount in the range of from about 50 to 100 percent is typical. From about 80 to 100 percent by weight of the binder is preferred.

The ultraviolet light absorbing hiding pigment should constitute at least about 5 percent by weight of the actinic light polymerizable coating composition. Amounts in the range of from about 5 percent to about 70 percent by weight of the polymerizable coating composition are satisfactory. From about 20 percent to about 70 percent is typical. An amount in the range of from about 33 percent to about 50 percent by weight is preferred.

The coating compositions of the invention are usually prepared by simply admixing the various ingredients. The compounds comprising the photocatalyst system may be premixed and then admixed with the other ingredients of the coating composition or they may be added separately. Although mixing is usually accomplished at room temperature, elevated temperatures are sometimes used. The maximum temperature which is usable depends upon the heat stability of the ingredients. Temperatures above about 200° C. are only rarely employed.

The actinic light polymerizable coating compositions of the invention are generally used to form polymerized adherent coatings on substrates. The substrate is coated with the coating composition using substantially any technique known to the art. These include spraying, curtain coating, dipping, roller application, printing, brushing, drawing and extrusion.

The coating may be polymerized by sequentially exposing the coated substrate to actinic light of the first kind and then to actinic light of the second kind. Polymerization may also be accomplished by sequentially exposing the coated substrate to actinic light of the second kind and then to actinic light of the first kind. Preferably, however, the coated substrate is exposed simultaneously to actinic light of the first kind and to actinic light of the second kind.

Any suitable sources of actinic light of the first kind and actinic light of the second kind may be used in the practice of this invention. Separate sources for the two kinds of actinic light may be used, but it is preferred to employ a source which emits both actinic light of the first kind and actinic light of the second kind. Suitable sources are mercury arcs, carbon arcs, low pressure mercury lamps, medium pressure mercury lamps, high pressure mercury lamps, swirl-flow plasma arc, ratio frequency induced mercury lamps and ultraviolet light emitting xenon flash lamps. Particularly preferred are ultraviolet light emitting lamps of the medium or high pressure mercury vapor type. Such lamps usually have fused quartz envelopes to withstand the heat and transmit the ultraviolet radiation and are ordinarily in the form of long tubes having an electrode at either end. Examples of these lamps are PPG Models 60-2032, 60-0393, 60-0197 and 60-2031 and Hanovia Models 6512A431, 6542A431, 6565A431 and 6577A431.

The wavelengths of electromagnetic radiation which are suitable for use as actinic light of the first kind and actinic light of the second kind may be ascertained from the general principles and definitions of the two kinds of actinic light heretofore set out. Usually, but not necessarily, actinic light of the first kind has a wavelength in the range of from about 185 to about 380 nanometers and acetinic light of the second kind has a wavelength in the range of from about 380 to about 500 nanometers.

The times of exposure to each kind of actinic light and the intensity of each kind of actinic light to which the coating composition is exposed may vary greatly. Generally, the exposure to both kinds of actinic light should continue until the C-stage is reached where the film is hard and infusible throughout its thickness.

The thickness of polymerized coatings of the actinic light polymerizable composition of the invention are subject to wide variation. Usually such thicknesses are in the range of from about 0.001 millimeter to about 0.3 millimeter. More often, they are in the range of from about 0.005 millimeter to about 0.2 millimeter. Typically, they are in the range of from about 0.012 millimeter to about 0.15 millimeter. When the actinic light polymerizable composition is an actinic light polymerizable printing ink, the polymerized coatings usually have thicknesses in the range of from about 0.001 millimeter to about 0.03 millimeter.

Substrates which may be coated with the compositions of this invention may vary widely in their properties. Organic substrates such as wood, fiberboard, particle board, composition board, paper, carboard and various polymers such as polyesters, polyamides, cured phenolic resins, cured aminoplasts, acrylics, polyurethanes and rubber may be used. Inorganic substrates are exemplified by glass, quartz and ceramic materials. Many metallic substrates may be coated. Exemplary metallic substrates are iron, steel, stainless steel, copper, brass, bronze, aluminum, magnesium, titanium, nickel, chromium, zinc and alloys.

The photopolymerization of compounds containing sites of ethylenic unsaturation is often inhibited by the presence of oxygen. The oxygen content of air is, in many instances, sufficient to preclude adequate polymerization of the thin layer of the coating having a surface which is adjacent to the air. In many cases, the interior of the coating may be adequately polymerized, but oxygen inhibition causes the surface to remain tacky and unsuitable for most applications. This phenomenon is known in the art as inadequate "surface cure". Although it is not desired to be bound by any theory, it is believed that the inhibition is due to the formation of peroxide at the site of chain propagation which quenches the reaction and thereby terminates chain growth.

It has now been found that oxygen inhibition of the photopolymerization of organic polymerizable materials containing a plurality of sites of ethylenic unsaturation may be substantially reduced by employing at least one aromatic ketone photopolymerization activator which has a triplet energy in the range of from about 54 kilocalories per mole to about 72 kilocalories per mole. Accordingly, substrates coated with the coating composition of the present invention may not only be exposed to actinic light in the presence of an inert atmosphere, viz., an atmosphere either containing no oxygen or only a concentration of oxygen which produces an insignificant degree of polymerization inhibition, but also in the presence of an atmosphere containing a polymerization inhibiting concentration of oxygen, such as air.

The actinic light polymerizable coating compositions of the present invention are particularly useful for coating steel and aluminum food and beverage cans.

In the illustrative examples which follow, all parts are parts by weight and percentages are percent by weight unless otherwise specified.

EXAMPLE I

A reactor equipped with a thermometer, a heater, a cooler, an agitator, a condensor set for total reflux, a source of air and a source of nitrogen is charged with 380.8 parts acrylic acid, 1.87 parts 2,6-di-tert-butyl-4-methylphenol and 1.86 parts triphenyl phosphine and an air sparge is applied. The charge is then heated to 110° C. A mixture comprising 385 parts epichlorohydrin and 166.6 parts Epon 828 bisphenol A-diglycidyl ether is preheated to about 110° C. Over a period of 4 hours, 551.6 parts of the preheated mixture is added to the reactor while maintaining the temperature of the reaction mixture in the range of from 110° C. to 111.7° C. Upon completion of the addition, the temperature of the reaction mixture is held in the range of from 110° C. to 113° C. for 75 minutes. At the end of this period (temperature: 112.2° C.), heat is shut off and cooling is applied. Fifteen minutes later (temperature: 96.1° C.), the condenser is set for distillation, a slight vacuum of 12 kilopascals (1 pacal=1 newton per square meter) is applied while maintaining an air sparge, and distillation is begun. Two hours later (temperature: 97.8° C.), 21 parts distillate has been removed and the vacuum is removed Thirty minutes later (temperature: 97.2° C.), a slight vacuum of 10.7 kilopascals is applied while maintaining an air sparge and distillation is again begun. Two hours later (temperature 97.2° C.), 7 additional parts distillate has been removed and the vacuum and air sparge are removed. Fifteen minutes later (temperature: 97.8° C.), the vacuum and air sparge are reapplied. Thirty minutes later (temperature: 97.8° C.), the vacuum and air sparge are removed, heat is shut off and cooling is applied. Forty-five minutes later when the temperature has reached 54.4° C., the product is discharged through a filter into containers. This intermediate product, which is a mixture of 3-chloro-2-hydroxypropyl acrylate, 2-chloro-1-(hydroxymethyl-)ethyl acrylate and the diacrylate of Epon 828 bisphenol A-diglycidyl ether, is found to have an acid number of 3.9, a Gardner-Holdt viscosity of K, a hydroxyl number of 242 and to contain 0.02 percent water and 14.1 percent chlorine.

A reactor equipped with an agitator, a heater, a packed distillation column, a condenser, thermometers and a source of nitrogen is charged with 272.8 parts ethylene glycol, 296 parts phthalic anhydride and 0.57 part butyl stannoic acid. A nitrogen sparge is applied, the contents of the reactor are heated to 195° C. and water is removed from the system. Fifty minutes later, the temperature has risen to 210° C. The temperature is then held in the range of from about 209° C. to about 210° C. for 40 minutes while water is removed. At the end of this time, the distillation column is bypassed so that the vapor from the reactor is vented through a condensor in a manner such that condensate is not required to the reactor. The liquid is maintained at temperatures in the range of from about 209° C. to about 211° C. for 1¼ hours and then discharged into containers. The product polyester resin has an acid number of 0.84, a Gardner-Holdt viscosity of Z-2⁺ and a total solids content greater than 99 percent.

A reactor equipped with a heater, a cooler, an agitator, a distillation column, condenser, phase separator, a vacuum source, a source of air and a source of nitrogen is charged with 777 parts of the above polyester resin, 475 parts acrylic acid, 173 parts toluene and 9.6 parts hydroquinone. The condenser and phase separator are set for total reflux. The reaction mixture is heated to 49° C. at an absolute pressure of about 80 kilopascals and 28.7 parts sulfuric acid is added. The absolute pressure is reduced to about 67 kilopascals and refluxing is observed. The condenser and phase separator are set for azeotropic distillation. One hour later, (temperature: 89° C., absolute pressure: 43 kilopascals), 52 parts water has been removed. After another hour, (temperature: 94° C.; absolute pressure: 36 kilopascals), a total of 98 parts water has been removed. After another 45 minutes, (temperature: 85° C., absolute pressure: 24 kilopascals), a total of 102 parts water has been removed. Heat is then removed and cooling is applied. When the temperature reaches 24° C., the vacuum is broken with nitrogen, 2210 parts toluene and 170 parts normal hexane are added and the mixture is well agitated. The mixture is then washed with 340 parts 20 percent aqueous sodium hydroxide solution using agitation while maintaining the temperature below 27° C. Agitation is stopped and the phases are allowed to separate. The aqueous layer is removed and 25 parts sodium sulfate is added and admixed with the organic phase. The mixture is filtered into containers to remove solid material. The filtrate (3188 parts) is charged back into the reactor. A solution is prepared by admixing 1.6 parts hydroquinone and 13.3 parts acetone and the solution (14.9 parts) is added to the reactor. The condenser is set for vacuum distillation. A vacuum is applied to reduce the absolute pressure to about 46.7 kilopascals, the contents of the reactor are heated to 60° C. and the removal of distillate is begun. The temperature of the liquid is maintained in the range of from about 52° C. to about 60° C. for 8⅓ hours while the absolute pressure is gradually reduced to 13.3 kilopascals and 1835 parts distillate is removed. During the next 3 hours 25 minutes, the absolute pressure is increased to 16 kilopascals and the temperature is increased to 61° C. At this time, a total of 2263 parts distillate has been removed. Distillation is stopped, heat is removed and cooling is begun. When the temprature reaches 27° C., the vacuum is broken with nitrogen. The stripped product, amounting to 896 parts, is admixed with 180 parts methanol and the mixture is subjected to stripping by batch vacuum distillation until the temperature of the remaining liquid is 60° C. at an absolute pressure of 3.3 kilopascals. The product, amounting to 769 parts, is cooled to about 27° C., the vacuum is broken with nitrogen and the product is discharged into containers. This product, a polyester diacrylate composition, has a solids content of greater than 99 percent, an acid number of 0.84 and a hydroxyl number of 13.

A pigment paste is prepared by grinding 200 parts rutile (RTC 2, Tioxide of Canada) with 100 parts of the above polyester diacrylate composition.

A coating composition is prepared by admixing 300 parts of the above pigment paste, 3 parts phenanthrenequinone, 300 parts of the above intermediate product and 6 parts benzophenone.

The coating composition is spread onto an aluminum substrate with a number 024 wire wound bar to provide a film having a thickness of about 0.03 millimeter. The coated substrate is passed once at 6.1 meters per minute, in air, under four medium pressure mercury vapor lamps, each operating at 78.7 watts per centimeter and emitting both ultraviolet light and visible light.

The lamps are 8.9 centimeters above the plane of the substrate surface and are spaced apart at intervals of about 20.3 centimeters. Passage of the coated substrate under the lamps causes polymerization of the film and produces a hard, adherent, white coating.

EXAMPLE II

A reactor equipped with a thermometer, a heater, a pressure equalizing dropping funnel, an agitator and an air sparge is charged with 725 parts acrylic acid, 4 parts 2,6-di-tert-butyl-p-cresol, 10 parts N,N-dimethylcyclohexylamine and 0.04 part hydroquinone. The charge is then heated to 100° C. and 1300 parts neopentyl glycol diglycidyl ether (XD 7114, Dow Chemical Co.) is added dropwise over 3.67 hours. After the addition is completed, the mixture is held at about 100° C. for 5.83 hours and then cooled to produce a diacrylate of neopentyl glycol diglycidyl ether product having an acid value of 14.

One hundred fifty parts of the above diacrylate of neopentyl glycol diglycidyl ether and 300 parts RTC 2 rutile are ground using a Cowles blade to form a fine intermediate paste. Three hundred parts of the above diacrylate of neopentyl glycol diglycidyl ether is added to and admixed with the intermediate paste to produce a pigment paste.

Coating Composition A is prepared by admixing 50 parts of the pigment paste and 1 part methyl phenylglyoxylate.

Coating Composition B is prepared by admixing 700 parts of the above pigment paste and 7 parts of phenanthrenequinone using a Cowles blade until the phenanthrenequinone dissolves.

Coating Composition C is prepared by admixing 50 parts of Composition B and 2 parts methyl phenylglyoxylate.

Coating Composition D through H are each prepared by admixing 50 parts of Coating Composition B with 1 part of a photopolymerization activator additive, the identities of which are shown in Table 1.

Each coating composition is drawn onto separate aluminum substrates with a number of 014 wire wound bar to provide films having thicknesses of about 0.02 millimeter. The coated substrates are each passed once at 15.2 meters per minute, in air, under the four lamps of Example I. The results are shown in Table 1, which follows.

ketone and 9 parts ethyl phenylglyoxylate. The whole is admixed to form an intermediate composition.

To 90 parts of the above intermediate composition are added 10 parts of methyl ethyl ketone and 10 parts of a 5% dispersion of phthalo blue pigment in the diacrylate of neopentyl glycol diglycidyl ether. After mixing, the resulting composition is filtered to produce a sprayable coating composition.

The sprayable coating composition is sprayed onto a metal substrate to form a film having a thickness of about 0.05 millimeter. The coated substrate is passed once at 3.05 meters per minute, in air, under the four lamps of Example I to polymerize the film into a hard, adherent, blue coating having a high gloss.

EXAMPLE IV

A reactor equipped with a thermometer, a heater, an addition funnel and an agitator is charged with 918 parts propylene carbonate. The charge is then heated to about 60° C. Over a period of one hour, 675 parts N-methylethanolamine is added while maintaining the temperature of the mixture at 60° to 70° C. Upon completion of the addition, the mixture is held at 60° to 70° C. for 1 hour and cooled to produce a first polyol intermediate.

A loop reactor equipped with a steam heated heater on one leg, a cooler on the other leg, a thermometer, a pressure gauge and a pump for circulating liquid in the loop is charged with 1210 parts of the first polyol intermediate and 14 parts crushed sodium hydroxide. The charge is heated to 99° C. and maintained in a range of from 99° to 108° C. at a pressure in the range from about 206 to about 290 kilopascals gauge for about 4½ hours during which time 970 parts propylene oxide is added. The reactor is cooled and vented and 14 parts crushed sodium hydroxide is added. The reaction mixture is heated to 99° C. and maintained in the range of from 99° C. to 107° C. at a pressure of from about 138 to about 311 kilopascals gauge for about 1¾ hours during which time 350 parts propylene oxide is added. The reactor is cooled. The next morning, the reactor is heated to 102° C. and maintained in the range of from Table 1

| Coating Composition | Phenanthrenequinone Content, Percent | Additive | Additive Content Percent | Through Cure | Surface Cure | Color | 60° Gloss |
|---|---|---|---|---|---|---|---|
| A | 0 | methyl phenylglyoxylate | 1.96 | poor | mar free | white | 83 |
| B | 0.99 | none | 0 | excellent | easily scratched | yellow | 76 |
| C | 0.95 | methyl phenylglyoxylate | 3.85 | excellent | mar free | white | 83 |
| D | 0.97 | methyl phenylglyoxylate | 1.96 | excellent | mar free | white | 81 |
| E | 0.97 | benzophenone | 1.96 | excellent | mar free | white | 86 |
| F | 0.97 | benzil | 1.96 | excellent | mar free | slightly yellow | 83 |
| G | 0.97 | 2-methylanthraquinone | 1.96 | excellent | mar free | slightly yellow | 82 |
| H | 0.97 | 2-chlorothioxanthone | 1.96 | excellent | mar free | slightly yellow | 81 |

EXAMPLE III

One hundred parts of the diacrylate of neopentyl glycol diglycidyl ether is admixed with 200 parts titanium dioxide (R960; E. I. duPont de Nemours and Co.) and ground to a fine paste with a Cowles blade. Three parts phenanthrenequinone is then added and ground into the paste with a Cowles blade. To the resulting mixture are added 300 parts of the diacrylate of neopentyl glycol diglycidyl ether, 20 parts methyl ethyl 101° C. to 107° C. at a pressure of from about 206 to about 345 kilopascals gauge for about one hour during which time 270 parts propylene oxide is added. The reactor is held at a temperature of from 105° to 110° C. at a pressure of from about 311 to about 345 kilopascals gauge for about three-fourths hour. The reactor is then cooled and vented, and the liquid contents of the reactor are drained into a container. The container is found to contain 2688 parts of product which is a second polyol intermediate.

To 2688 parts of the second polyol intermediate is added 28 parts of 86% phosphoric acid at 60° C. After mixing, a sample of the reaction mixture is taken and diluted with an equal weight of water. The pH of the diluted sample is measured and found to be less than 7.0. A vacuum is applied to the reaction mixture and the reaction mixture is heated to 120° C. and held at that temperature for one-half hour. The vacuum is then released, and one percent diatomaceous earth filter aid (Hy-Flo), based on the weight of total charge, is added. The mixture is then filtered in a pressure filter to form a third polyol intermediate.

A reactor equipped with a thermometer, a heater, an addition funnel, an agitator and an air sparge is charged with 222 parts 1-isocyanatomethyl-5-isocyanato-1,3,3-trimethylcyclohexane, 132 parts phenylcellulose acrylate, 1 part N,N-dimethylcyclohexylamine and 0.2 part dibutyl tin dilaurate. The charge is heated to 50° C. Over a period of 1 hour, 178 parts of the third polyol intermediate is added. Upon completion of the addition, the reaction mixture is held at 50° C. for 1 hour and then at 70° C. for 2 hours. Over a period of 5 to 10 minutes at 70° C. under an air sparge, 0.5 part 2,6-di-tert-butyl-p-cresol and 130 parts 2-hydroxyethyl acrylate are added. The reaction mixture is held at 70° C. for 6 hours. Twenty-five parts 2-hydroxyethyl acrylate is added. The reaction mixture is then held at 85° C. for 2 hours and cooled to produce a polyurethane terminated with acrylyl groups.

A reactor equipped with a thermometer, a heater, a pressure equalizing addition funnel and an agitator is charged with 275 parts acrylic acid, 4 parts N,N-dimethylcyclohexylamine, 1.6 parts 2,6-di-tert-butyl-p-cresol and 0.015 part hydroquinone. The charge is then heated to 100° C. and 500 parts 1,4-butanediol diglycidyl ether (Araldite RD-2, Ciba Geigy) is added dropwise over 6 hours. After the addition is completed, the mixture is held at 100° C. for 2 hours and then cooled to produce a diacrylate of 1,4-butanediol diglycidyl ether product having an acid value of 6.

One hundred parts of the diacrylate of 1,4-butanediol diglycidyl ether and 150 parts titanium dioxide are combined and ground to a fine paste.

A coating composition is prepared by admixing 25 parts of the above fine paste, 5 parts 2-hydroxyethyl acrylate, 15 parts of the polyurethane terminated with acrylyl groups, 0.45 part phenanthrenequinone and 0.45 part ethyl phenylglyoxylate.

The coating composition is drawn down on an aluminum substrate with a number 009 wire wound bar to provide a film having a thickness of about 0.01 millimeter. The coated substrate is passed once at 45.7 meters per minute, in air, under the four lamps of Example I to produce a tough, nearly completely adherent coating.

The coating composition is drawn down on an aluminum substrate with a number 026 wire wound draw bar to provide a film having a thickness of about 0.03 millimeter. The coated substrate is exposed to the four lamps of Example I to produce a flexible coating having high gloss.

I claim:

1. A photocatalyst system comprising
   a. at least one aromatic ketone photopolymerization activator having a triplet energy in the range of from about 54 kilocalories per mole to about 72 kilocalories per mole, wherein said photopolymerization activator is represented by the formula:

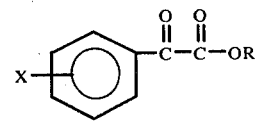

wherein
   R is hydrogen, alkyl containing from one to about twenty-two carbon atoms, benzyl, phenyl, hydroxyalkyl containing from 1 to about 10 carbon atoms, chloroalkyl containing from 1 to about 10 carbon atoms, bromoalkyl containing from 1 to about 10 carbon atoms, alkoxyalkyl where the alkoxy portion contains from 1 to about 4 carbon atoms and where the alkyl portion contains from 1 to about 10 carbon atoms, phenoxyalkyl where the alkyl portion contains from 1 to about 10 carbon atoms;
   X is hydrogen, halo, alkoxy containing from 1 to about 4 carbon atoms or alkyl containing from 1 to about 4 carbon atoms;
   b. phenanthrenequinone.

2. The photocatalyst system of claim 1 wherein said photopolymerization activator is present in an amount in the range of from about 25 percent to about 98 percent by weight of said photocatalyst system and wherein said phenanthrenequinone is present in an amount in the range of from about 2 percent to about 75 percent by weight of said photocatalyst system.

3. The photocatalyst system of claim 1 wherein X is located in the ortho position.

4. The photocatalyst system of claim 2 wherein said photopolymerization activator is selected from the group consisting of methyl phenylglyoxylate, ethyl phenylglyoxylate, butyl phenylglyoxylate and butoxyethyl phenylglyoxylate.

5. An actinic light polymerizable coating composition comprising:
   a. at least one aromatic ketone photopolymerization activator having a triplet energy in the range of from about 54 kilocalories per mole to about 72 kilocalories per mole;
   b. phenanthrenequinone;
   c. organic polymerizable material containing a plurality of sites of ethylenic unsaturation and capable of being free radically addition polymerized by interaction with said aromatic ketone photopolymerization activator and said phenanthrenequinone upon exposure to actinic light, said organic polymerizable material comprising ethylenically unsaturated polyester containing a plurality of sites of ethylenic unsaturation, polymer having a plurality of sites of acrylic unsaturation, monomer having a plurality of sites of acrylic unsaturation or mixture thereof; and
   d. ultraviolet light absorbing hiding pigment.

6. The actinic light polymerizable coating composition of claim 5 wherein:
   a. said photopolymerization activator is present in an amount in the range of from about 0.01 percent to about 50 percent by weight based on the weight of the binder of said coating composition;
   b. said phenanthrenequinone is present in an amount in the range of from about 0.005 percent to about 5 percent by weight based on the weight of the binder of said coating composition;

c. said organic polymerizable material is present in an amount in the range of from about 20 to about 100 percent by weight of the binder of said coating composition;

d. said ultraviolet light absorbing hiding pigment is present in an amount in the range of from about 5 percent to about 70 percent by weight of said coating composition.

7. The actinic light polymerizable coating composition of claim 6 wherein said photopolymerization activator is represented by the formula:

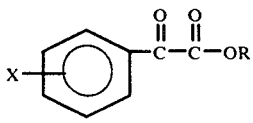

wherein

R is hydrogen, alkyl containing from 1 to about 22 carbon atoms, benzyl, phenyl, hydroxyalkyl containing from 1 to about 10 carbon atoms, chloroalkyl containing from 1 to about 10 carbon atoms, bromoalkyl containing from about 1 to about 10 carbon atoms, alkoxyalkyl where the alkoxy portion contains from 1 to about 4 carbon atoms and where the alkyl portion contains from 1 to about 10 carbon atoms, or phenoxyalkyl where the alkyl portion contains from one to about ten carbon atoms; and x is hydrogen, halo, alkoxy containing from one to about four carbon atoms or alkyl containing from one to about four carbon atoms.

8. The actinic light polymerizable coating composition of claim 7 wherein X is located in the ortho position.

9. The actinic light polymerizable coating composition of claim 6 wherein said photopolymerization activator is selected from the group consisting of methyl phenylglyoxylate, ethyl phenylglyoxylate, butyl phenyglyoxylate and butoxyethyl phenylglyoxylate.

10. The actinic light polymerizable coating composition of claim 6 wherein said ultraviolet light absorbing hiding pigment is selected from the group consisting of titanium dioxide, zinc sulfide, zinc oxide, antimony trioxide and lithopone.

11. The actinic light polymerizable coating composition of claim 6 wherein said ultraviolet light absorbing hiding pigment is rutile.

12. The actinic light polymerizable coating composition of claim 11 wherein said photopolymerization activator is selected from the group consisting of methyl phenylglyoxylate, ethyl phenylglyoxylate, butyl phenylglyoxylate and butoxyethyl phenylglyoxylate.

13. The actinic light polymerizable coating composition of claim 12 wherein said organic polymerizable material comprises polymer having a plurality of sites of acrylic unsaturation, moxomer having a plurality of sites of acrylic unsaturation and mixture thereof.

14. A method comprising:
a. coating a substrate with an actinic light polymerizable coating composition comprising:
1. at least one aromatic ketone photopolymerization activator having a triplet energy in the range of from about 54 kilocalories per mole to about 72 kilocalories per mole,
2. phenanthrenequinone,
3. organic polymerizable material containing a plurality of sites of ethylenic unsaturation and capable of being free radically addition polymerized by interaction with said aromatic ketone photopolymerization activator and said phenanthrenequinone upon exposure to actinic light, said organic polymerizable material comprising ethylenically unsaturated polyester containing a plurality of sites of ethylenic unsaturation, polymer having a plurality of sites of acrylic unsaturation, monomer having a plurality of sites of acrylic unsaturation or mixture thereof; and
4. ultraviolet light absorbing hiding pigment; and
b. exposing said coated substrate to actinic light of the first kind and to actinic light of the second kind, said actinic light of the first kind
1. having a wavelength in the ultraviolet region of the spectrum such that said ultraviolet light absorbing hiding pigment is substantially opaque thereto, and
2. being absorbable by said photopolymerization activator to produce free radicals capable of causing polymerization of acrylic groups,
said actinic light of the second kind
3. having a wavelength longer than that of said actinic light of the first kind and such that said ultraviolet light absorbing pigment is substantially transparent thereto, and
4. being absorbable by said phenanthrenequinone to produce free radicals capable of causing polymerization of acrylic groups
to thereby polymerize said coating into a hard, infusible film throughout its thickness.

15. The method of claim 14 wherein
a. said photopolymerization activator is present in an amount in the range of from about 0.001 percent to about 50 percent by weight based on the weight of the binder of said coating composition;
b. said phenanthrenequinone is present in an amount in the range of from about 0.005 percent to about 5 percent by weight based on the weight of the binder of said coating composition;
c. said organic polymerizable material is present in an amount in the range of from about 20 to about 100 percent by weight of the binder of said coating composition;
d. said ultraviolet light absorbing hiding pigment is present in an amount in the range of from about 5 percent to about 70 percent by weight of said coating composition.

16. The method of claim 15 wherein said exposure is conducted in an atmosphere containing a polymerization inhibiting concentration of oxygen.

17. The method of claim 15 wherein said exposure is conducted in air.

18. The method of claim 15 wherein said actinic light of the first kind has a wavelength in the range of from about 185 to about 380 nanometers and wherein said actinic light of the second kind has a wavelength in the range of from about 380 to about 500 nanometers.

19. The method of claim 15 wherein said coated substrate is exposed to both actinic light of the first kind and to actinic light of the second kind simultaneously.

20. The method of claim 15 wherein said ultraviolet light absorbing hiding pigment is selected from the group consisting of titanium dioxide, zinc sulfide, zinc oxide, antimony trioxide and lithopone.

21. The method of claim 15 wherein said ultraviolet light absorbing hiding pigment is rutile.

22. The method of claim 15 wherein said photopolymerization activator is represented by the formula:

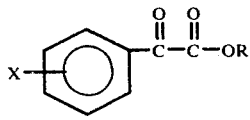

wherein

R is hydrogen, alkyl containing from 1 to about 22 carbon atoms, benzyl, phenyl, hydroxyalkyl containing from 1 to about 10 carbon atoms, chloroalkyl containing from 1 to about 10 carbon atoms, bromoalkyl containing from 1 to about 10 carbon atoms, alkoxyalkyl where the alkoxy portion contains from 1 to about 4 carbon atoms and where the alkyl portion contains from 1 to about 10 carbon atoms, or phenoxyalkyl where the alkyl portion contains from 1 to about 10 carbon atoms; and X is hydrogen, halo, alkoxy containing from 1 to about 4 carbon atoms or alkyl containing from 1 to about 4 carbon atoms.

23. The method of claim 22 wherein X is located in the ortho position.

24. The method of claim 15 wherein said photopolymerization activator is selected from the group consisting of methyl phenylglyoxylate, ethyl phenylglyoxylate, butyl phenylglyoxylate and butoxyethyl phenylglyoxylate.

25. A method comprising:
  a. coating a substrate with an actinic light polymerizable coating composition comprising:
    1. a photopolymerization activator selected from the group consisting of methyl phenylglyoxylate, ethyl phenylglyoxylate, butyl phenylglyoxylate and butoxyethyl phenylglyoxylate,
    2. phenanthrenequinone,
    3. organic polymerizable material containing a plurality of sites of ethylenic unsaturation and capable of being free radically addition polymerized by interaction with said aromatic ketone photopolymerization activator and said phenanthrenequinone upon exposure to actinic light, said organic polymerizable material comprising polymer having a plurality of sites of acrylic unsaturation, monomer having a plurality of sites of acrylic unsaturation or mixture thereof, and
    4. rutile;
  b. exposing said coated substrate, in air, to actinic light of the first kind and to actinic light of the second kind, said actinic light of the first kind
    1. having a wavelength in the ultraviolet region of the spectrum such that said rutile is substantially opaque thereto and
    2. being absorbable by said photopolymerization activator to produce free radicals capable of causing polymerization of acrylic groups,
  said actinic light of the second kind
    3. having a wavelength such that said rutile is substantially transparent thereto, and
    4. being absorbable by said phenanthrenequinone to produce free radicals capable of causing polymerization of acrylic groups
  to thereby polymerize said coating into a hard, infusible film throughout its thickness.

26. The method of claim 25 wherein:
  a. said photopolymerization activator is present in an amount in the range of from about 0.01 percent to about 50 percent by weight based on the weight of the binder of said coating composition;
  b. said phenanthrenequinone is present in an amount in the range of from about 0.005 percent to about 5 percent by weight based on the weight of the binder of said coating composition;
  c. said organic polymerizable material is present in an amount in the range of from about 20 to about 100 percent by weight of the binder of said coating composition;
  d. said rutile is present in an amount in the range of from about 5 percent to about 70 percent by weight of said coating composition.

27. The method of claim 26 wherein said coated substrate is exposed to both actinic light of the first kind and to actinic light of the second kind simultaneously.

* * * * *